United States Patent
Sell et al.

(10) Patent No.: US 6,548,350 B2
(45) Date of Patent: Apr. 15, 2003

(54) METHOD OF FABRICATING AN INTEGRATED CIRCUIT CONFIGURATION WITH AT LEAST ONE CAPACITOR

(75) Inventors: Bernhard Sell, Dresden (DE); Dirk Schumann, Dresden (DE); Josef Willer, Riemerling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/093,039

(22) Filed: Mar. 7, 2002

(65) Prior Publication Data

US 2002/0137280 A1 Sep. 26, 2002

Related U.S. Application Data

(63) Continuation of application No. PCT/DE00/03123, filed on Sep. 6, 2000.

(30) Foreign Application Priority Data

Sep. 7, 1999 (DE) .................................. 199 42 680

(51) Int. Cl.⁷ .................................. H01L 21/8242
(52) U.S. Cl. .................................. 438/253; 257/308
(58) Field of Search .................................. 438/253, 396, 438/241, 244; 257/308, 309

(56) References Cited

U.S. PATENT DOCUMENTS

| | | | |
|---|---|---|---|
| 5,124,766 A | 6/1992 | Clark | 357/23.6 |
| 5,126,810 A | 6/1992 | Gotou | 357/23.6 |
| 5,196,365 A | 3/1993 | Gotou | 437/52 |
| 5,550,080 A | 8/1996 | Kim | 437/60 |
| 5,604,148 A | 2/1997 | Lur | 438/60 |
| 5,756,388 A | 5/1998 | Wu | 438/397 |
| 5,763,305 A | 6/1998 | Chao | 438/253 |
| 6,077,739 A * | 6/2000 | Chang | 438/243 |
| 6,413,832 B1 * | 7/2002 | Wu et al. | 438/396 |

FOREIGN PATENT DOCUMENTS

| | | |
|---|---|---|
| DE | 197 20 202 A1 | 2/1998 |
| EP | 0 386 947 A2 | 9/1990 |
| EP | 0 415 530 B1 | 3/1991 |
| JP | 08 046 154 A | 2/1996 |
| JP | 08 181 291 A | 7/1996 |
| JP | 09 017 971 | 1/1997 |
| WO | 197 20 270 A1 | 2/1998 |

* cited by examiner

*Primary Examiner*—David Nelms
*Assistant Examiner*—Quoc Hoang
(74) *Attorney, Agent, or Firm*—Laurence A. Greenberg; Werner H. Stemer; Ralph E. Locher

(57) ABSTRACT

The capacitor is arranged on the surface of a substrate. A first capacitor electrode has a middle part and a side part, which point vertically upwards, are arranged beside each other and are connected with each other via an upper part located above said middle part and said side part. The middle part is longer than the side part and is connected with other components of the circuit configuration located below said middle part and said side part. The first capacitor electrode is provided with a capacitor dielectric. A second capacitor electrode borders the capacitor dielectric.

11 Claims, 5 Drawing Sheets

METHOD OF FABRICATING AN INTEGRATED CIRCUIT CONFIGURATION WITH AT LEAST ONE CAPACITOR

CROSS-REFERENCE TO RELATED APPLICATION

This application is a continuation of copending International Application PCT/DE00/03123, filed Sep. 6, 2000, which designated the United States.

BACKGROUND OF THE INVENTION

FIELD OF THE INVENTION

The invention lies in the field of integrated technology and relates, more specifically, to an integrated circuit configuration, that is to say a circuit configuration which is arranged in a substrate, with at least one capacitor.

An integrated circuit configuration of this type is described, for example, in European patent EP 0 415 530 B1 (see U.S. Pat. Nos. 5,126,810 and 5,196,365). The integrated circuit configuration is a memory cell arrangement wherein a memory cell comprises a transistor and a capacitor. The capacitor is embodied as a stacked capacitor and comprises a polysilicon structure with a plurality of polysilicon layers which are essentially arranged parallel one above the other and are connected to one another via at least one lateral support. The polysilicon structure is formed by the alternate deposition of polysilicon layers and $SiO_2$ layers, which can be etched selectively with respect thereto, on the surface of the substrate, patterning of the sidewall, production of layers coverings (spacers) made of polysilicon on at least one sidewall of the layer structure and selective etching-out of the $SiO_2$ layers. The polysilicon structure acts as a first capacitor electrode of the capacitor. The areas of the polysilicon structure are provided with a capacitor dielectric. Afterward, a second capacitor electrode of the capacitor is produced, which adjoins the capacitor dielectric. Despite the capacitor having a small space requirement, that is to say the capacitor having a small area when projected onto the substrate surface, the capacitor has a large capacitance since the surface area of the polysilicon structure is very large on account of the layers that are arranged one above the other.

SUMMARY OF THE INVENTION

It is accordingly an object of the invention to provide a method for fabricating an integrated circuit configuration with at least one capacitor which overcomes the above-mentioned disadvantages of the heretofore-known devices and methods of this general type and which, in comparison with the prior art, can have a smaller space requirement yet a high capacitance at the same time. With the foregoing and other objects in view there is provided, in accordance with the invention, a method of producing an integrated circuit configuration with at least one capacitor, which comprises:

providing a substrate having a surface defining a y-axis extending substantially perpendicular to the surface and defining a first height, a second height above the first height, and a third height between the first height and the second height;

producing a central part of a first capacitor electrode of the capacitor to extend from the first height to the second height, by forming a depression in an auxiliary layer applied on the substrate and filling the depression at least partly with conductive material;

after producing the central part, etching the auxiliary layer no deeper than to the third height;

producing a component of the integrated circuit configuration and connecting the component to the central part produced thereabove;

producing a spacer reaching at most to the second height, by depositing and etching back material as part of a spacing means, on uncovered parts of lateral areas of the central part;

growing conductive material, by selective epitaxy, on the central part but not on the spacing means;

depositing further conductive material substantially conformally;

etching back the conductive material to thereby produce from the conductive material
  at least one side part of the first capacitor electrode beside the central part and spaced apart from the central part, such that the side part extends from the third height to the second height;
  an upper part of the first capacitor electrode on the side part and the central part and connecting the side part and the central part to one another; and to partly uncover a portion of the spacing means that projects laterally below the side part;

providing the first capacitor electrode with a capacitor dielectric; and producing a second capacitor electrode adjoining the capacitor dielectric.

The resulting product is an integrated circuit configuration with at least one capacitor wherein the capacitor is arranged above a surface of a substrate. A y-axis runs perpendicularly to the surface of the substrate. A first capacitor electrode of the capacitor has a central part, which extends from a first height as far as a second height situated above the latter, with respect to the y-axis. The central part is connected to a component—arranged below it—of the integrated circuit configuration. The first capacitor electrode has at least one side part, which is arranged beside the central part and is spaced apart from the latter. The side part extends from a third height, which lies between the first height and the second height, as far as the second height. The first capacitor electrode has an upper part which is arranged on the side part and the central part and connects these to one another. The first capacitor electrode is provided with a capacitor dielectric. A second capacitor electrode adjoins the capacitor dielectric.

The method may also be summarized as follows: The capacitor is produced above a surface of a substrate. A central part of a first capacitor electrode of the capacitor is produced in such a way that it extends from a first height as far as a second height situated above the latter, with respect to the y-axis. A component of the integrated circuit configuration is produced and is connected to the central part produced above it. At least one side part of the first capacitor electrode is produced in such a way that it is arranged beside the central part and is spaced apart from the latter. The side part is produced in such a way that it extends from a third height which lies between the first height and the second height, as far as the second height. An upper part of the first capacitor electrode is produced in such a way that it is arranged on the side part and the central part and connects these to one another. The first capacitor electrode is provided with a capacitor dielectric. A second capacitor electrode is produced in such a way that it adjoins the capacitor dielectric.

Since the capacitor dielectric covers all the areas of the first capacitor electrode starting at least from the third height, and the second capacitor electrode covers the capacitor dielectric, a part of the second capacitor electrode is also arranged between the lateral part and the central part.

As a result of the cutout in the first capacitor electrode between the central part and the side part, the surface of the first capacitor electrode, which greatly influences the capacitance of the capacitor, is enlarged primarily by lateral areas of the side part and of the central part in comparison with a capacitor electrode without a cutout, without the space requirement of the capacitor being increased. The larger the distance between the third height and the first height, the larger the capacitance of the capacitor.

A particularly large capacitance of the capacitor is obtained if the third height is nearer to the first height than to the second height.

The first capacitor electrode can be produced for example with the aid of a spacing means. To that end, an auxiliary layer is produced above the substrate. The central part is produced by producing a depression in the auxiliary layer and filling it with conductive material. The spacing means is formed in such a way that it adjoins lateral areas of the central part and projects laterally away from the central part below the third height. The upper part and the side part are produced in such a way that they adjoin the spacing means. The upper part adjoins the spacing means from above, while the side part laterally adjoins the spacing means and also adjoins from above the part of the spacing means which projects laterally away from the central part below the third height. The part of the spacing means which adjoins the lateral areas of the central part is consequently arranged between the central part and the side part, while the part of the spacing means which projects laterally away from the central part below the third height is arranged below the side part and can project laterally below the side part. Since this part is not covered by the side part at least laterally and possibly also partly from above, the spacing means can be removed by isotropic etching selectively with respect to the first capacitor electrode. The capacitor dielectric and the second capacitor electrode are subsequently produced.

In order to reduce the space requirement of the capacitor it is advantageous to produce the part of the spacing means which adjoins the lateral areas of the central part with a particularly small horizontal thickness. The horizontal thickness of this part of the spacing means is preferably homogeneous, that is to say that this part of the spacing means has the same thickness everywhere.

In order to reduce the space requirement of the capacitor, it is advantageous to produce the central part and the side part in such a way that their lateral areas are essentially parallel to the y-axis.

Given a homogeneous horizontal thickness of the part of the spacing means which adjoins the lateral areas of the central part, the lateral areas of the side part which face the central part follow the course of the lateral areas of the central part at an essentially constant distance from the lateral areas of the central part. Specifically, said distance is equal to the horizontal thickness of the spacing means.

A particularly large capacitance is obtained if the side part laterally surrounds the central part.

However, it is also possible to provide, say, two side parts which do not adjoin one another.

It is possible to provide more than one side part, which are at different distances from the central part. Each of the side parts may laterally surround the central part. A first side part which is arranged further away from the central part than a second side part also laterally surrounds the second side part. The side parts are interleaved in one another.

A first method is described below, wherein a spacing means is used whose part which adjoins the lateral areas of the central part has a homogeneous horizontal thickness.

After the production of the central part, the auxiliary layer is etched no deeper than as far as the third height. By depositing and etching back material, as part of the spacing means, a spacer is produced on uncovered parts of the lateral areas of the central part. The spacer reaches at most as far as the second height, so that at least one upper horizontal area of the central part is uncovered. The part of the spacing means which is produced as a spacer consequently adjoins the lateral areas of the central part and has an essentially homogeneous horizontal thickness. Material below the third height serves as a further part of the spacing means. Afterward, conductive material is grown by selective epitaxy in such a way that the conductive material grows on the central part but not on the spacing means. Further conductive material is deposited and subsequently etched back, so that the upper part is produced from the epitaxially grown conductive material and the side part is produced from the deposited conductive material, and the part of the spacing means which projects laterally below the side part is uncovered. Since the conductive material on the upper area of the central part is particularly thick on account of the selective epitaxy, conductive material, which can essentially form the upper part, remains on the central part during the etching back until the spacing means is uncovered.

The material from which the part of the spacing means which is produced as a spacer is produced can be etched back further than the thickness to which the material is deposited. In this case, upper regions of the lateral areas of the central part on which the conductive material can grow are also uncovered. During the etching back of the material, the material which is arranged below the third height, i.e. below the removed part of the auxiliary layer, can also be attacked. This is the case in particular when the same material is involved. Since the side part is to be arranged on the spacing means and the side part extends upward from the third height, the third height is defined by the depth to which the auxiliary layer is etched and the extent to which the material of the spacer is etched back.

By way of example, tungsten or tungsten silicide is suitable as conductive material if the central part is likewise composed of tungsten or tungsten silicide. However, any conductive material which grows on the central part but not on the spacing means is suitable.

The spacing means is composed, for example, of silicon nitride or of $SiO_2$.

A particularly small space requirement of the capacitor is obtained if the depression is produced with the aid of a mask whose opening has dimensions which correspond to the minimum feature size F that can be fabricated in the technology used. Consequently, the central part produced by filling the depression also has a width and/or a length corresponding to the feature size F.

An even smaller space requirement can be obtained if, after the etching of the auxiliary layer, the central part is narrowed by isotropic etching. In this case the width and/or the length of the central part may even be smaller than the feature size F.

As an alternative, the mask used for the depression can be enlarged by spacers, so that the opening of the mask has dimensions which are smaller than the feature size F. In this case, the central part has particularly small horizontal dimensions even without isotropic etching.

Since such a central part has a horizontal cross section which is smaller than $F^2$, the entire capacitor can have a space requirement of only $F^2$.

In order to produce such an enlarged mask, material is deposited and etched back after the production of the mask with the aid of photolithographic process steps, with the result that spacers are produced in the opening of the mask, which spacers enlarge the mask, that is to say narrow the opening. As an alternative, it is possible to fabricate an opening with a smaller cross section than $F^2$ using CARL (chemical amplification of resist lines). In this case, the mask is enlarged by silylation.

If more than one side part is to be produced, then after the production of the side part, a further spacing means can be produced analogously to the spacing means. The further spacing means laterally adjoins the side part. Afterward, conductive material is grown again by means of selective epitaxy, thereby enlarging the upper part. As in the production of the side part, further conductive material is deposited and etched back, thereby producing a further side part. This sequence of process steps can be repeated to produce additional side parts.

A second possibility for producing an integrated circuit configuration with at least one capacitor is described below, wherein a spacing means is used whose part which adjoins the lateral areas of the central part has a homogeneous horizontal thickness.

A further auxiliary layer is produced on the auxiliary layer. The depression cuts through the further auxiliary layer. After the production of the depression, the further auxiliary layer is etched isotropically, thereby extending the depression in the region of the further auxiliary layer. By filling the depression with the conductive material, the central part is produced in the region of the auxiliary layer and a part of the upper part is produced in the region of the further auxiliary layer. The upper part is thus arranged on the central part and projects beyond the central part laterally in all directions. The further auxiliary layer and the auxiliary layer are etched selectively with respect to the part of the upper part anisotropically as far as the third height, so that at least one part of the spacing means is formed from the auxiliary layer below the part of the upper part. This part of the spacing means consequently adjoins the lateral areas of the central part and has an essentially homogeneous horizontal thickness on account of the production of the part of the upper part with the aid of isotropic etching. The side part and a residual part of the upper part are subsequently produced in the form of a spacer by depositing and etching back material, parts of the spacer which laterally adjoin the part of the upper part and lie at the same height as the part of the upper part forming the residual part of the upper part.

The spacing means is produced in a self-aligned manner that is to say without a mask to be aligned, below the upper part and adjoining the central part. The distance between the edge of the non-extended depression and the edge of the extended depression determines the thickness of the part of the spacing means, which adjoins the lateral areas of the central part. Since the isotropic etching of the further auxiliary layer removes material uniformly proceeding from the original depression, the thickness of the spacing means is homogeneous. The further auxiliary layer can be dispensed with if, for the purpose of filling the depression, conductive material is deposited and is subsequently patterned with the aid of a mask in such a way that conductive material likewise remains on the auxiliary layer around the central part and forms the part of the upper part. In this case, on account of alignment inaccuracies of the mask, a homogeneous horizontal thickness of the part of the spacing means cannot be guaranteed. In order that the part of the upper part can be produced with essentially perpendicular edges, it is advantageous to produce on the further auxiliary layer a mask layer, which is cut through by the depression. The mask layer is removed only after the isotropic etching of the further auxiliary layer and before the filling of the depression. This also has the advantage that the thickness of the upper part is determined by the thickness of the further auxiliary layer. If the mask layer is dispensed with, then a thicker further auxiliary layer must be deposited in order to obtain the same thickness of the upper part, since the auxiliary layer is also eroded from above during the isotropic etching.

The following method is suitable in particular for producing a plurality of side parts:

The depression is produced in the auxiliary layer in such a way that it initially reaches as far as the third height. A surface of the auxiliary layer lies higher than the first height. Afterward, layers made alternately of conductive material and of insulating material are deposited, without filling the depression, and etched back. Side parts are produced by the etching back of the conductive material and parts of spacing means are produced by the etching back of the insulating material. The number of layers made of conductive material is equal to the number of side parts produced. A part of the bottom of the depression which is uncovered after the etching back of the last layer made of insulating material is subsequently etched more deeply at least as far as the first height. The as yet unfilled part of the depression is filled with conductive material by depositing conductive material and etching it back as far as above the first height. Conductive material which is surrounded by the innermost spacing means forms the central part. Conductive material which is arranged on the side parts, the spacing means and the central part forms the upper part. Preferably, layers deposited later are etched back further than layers deposited previously, in order that there is better contact between the upper part and the side parts.

By way of example, a part of the auxiliary layer is suitable as a part of the spacing means which projects laterally away from the central part.

In order to accurately set the etching depth when etching the auxiliary layer, it is advantageous to produce above the substrate a stop layer whose upper area lies in the region of the third height and to produce the auxiliary layer above that. The depression cuts through the stop layer. The part of the spacing means which projects laterally away from the central part is consequently the stop layer. The stop layer acts as an etching stop during the etching of the auxiliary layer. The stop layer can also act as an etching stop during the etching back of the material of the side part. In this case, an upper area of the stop layer lies at the third height.

The stop layer, the part of the spacing means which adjoins the lateral areas of the central part and the auxiliary layer are composed, for example, of silicon nitride or $SiO_2$. In order to enable selective etching, it is advantageous if the stop layer is composed of a different material than the auxiliary layer.

The integrated circuit configuration may be a DRAM cell arrangement. By way of example, the component is a transistor which, together with the capacitor, forms a memory cell.

A particularly high packing density of the DRAM cell arrangement can be achieved if the capacitors of memory cells are arranged in rows and columns. In order that the side parts which, considered in vertical cross section, are arranged between the central parts have more space, it is advantageous to produce the central part in such a way that a width of the central part which is parallel to the direction of the rows is smaller than a distance between adjacent central parts of capacitors which are adjacent to one another along the rows. Correspondingly, a length of the central part which is parallel to the direction of the columns is preferably smaller than a distance between central part of capacitors which are adjacent to one another along the columns.

A horizontal cross section of the central part may be, for example, rectangular, in particular square, or circular.

The length or width of the central part may be smaller than the feature size F. For the case of the circular cross section, the width or the length of the central part is the diameter of the cross section. The space requirement per memory cell may be $4F^2$.

Other features which are considered as characteristic for the invention are set forth in the appended claims.

Although the invention is illustrated and described herein as embodied in a integrated circuit configuration with at least one capacitor and method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings

It will be understood by those of skill in the art that the figures are not true to scale.

DESCRIPTION OF THE PREFERRED EMBODIMENTS

Figure 1:
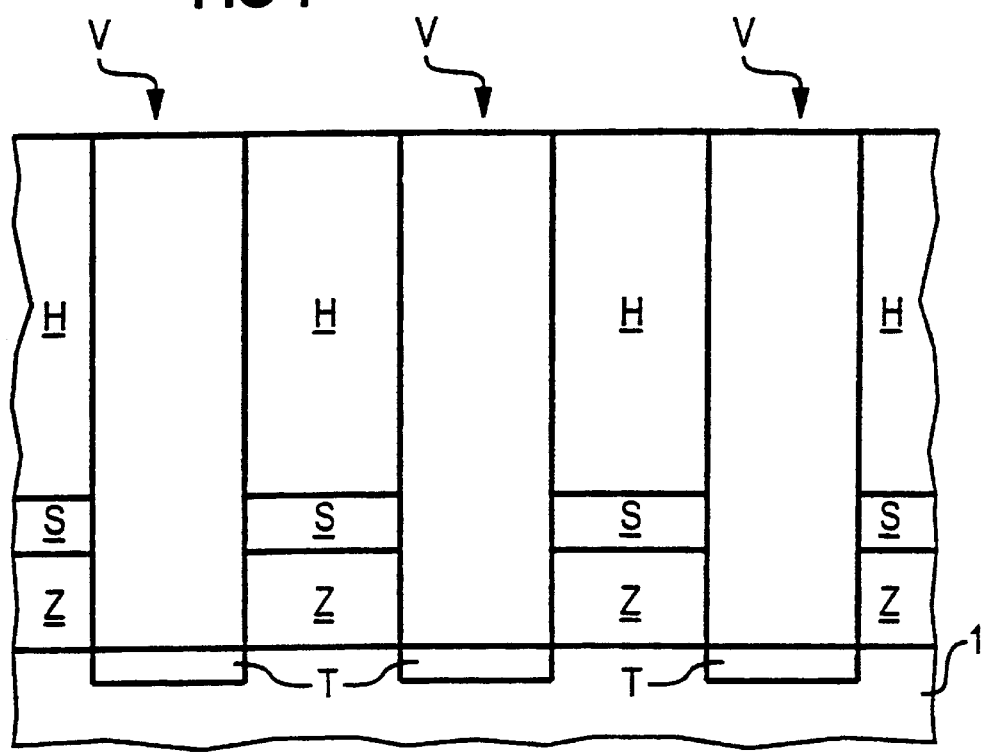
FIG. 1 is a sectional view through a substrate after the production of transistors, an intermediate oxide, a stop layer, an auxiliary layer, and depressions.

Referring now to the figures of the drawing in detail and first, particularly, to FIG. 1 thereof, there is shown a first exemplary embodiment with a first substrate 1 made of silicon provided as the starting material. Transistors T are produced according to the prior art in the region of a surface of the first substrate 1. The transistors T are only diagrammatically indicated in FIG. 1.

Afterward, an intermediate oxide Z made of $SiO_2$ and having a thickness of approximately 200 nm is produced on the first substrate 1 (see FIG. 1). A stop layer S is produced above the intermediate oxide by depositing silicon nitride to a thickness of approximately 30 nm (see FIG. 1). An auxiliary layer H is produced above that by depositing BPSG (borophosphorus silicate glass) to a thickness of approximately 800 nm (see FIG. 1).

By means of a photolithographic method, depressions V are produced which cut through the auxiliary layer H, the stop layer S and the intermediate oxide Z and reach as far as the transistors T (see FIG. 1). A suitable etchant is e.g. $CF_4+CHF_3$. The depressions V have a square horizontal cross section whose side length is approximately 100 nm. The depressions V are arranged in rows and columns. Depressions V that are adjacent to one another along the columns are at a distance of approximately 100 nm from one another. Depressions V that are adjacent to one another along the rows are at a distance of approximately 100 nm from one another.

Afterward, tungsten is deposited to a thickness of approximately 100 nm and planarized by chemical mechanical polishing (CMP) until the auxiliary layer H is exposed (see FIG. 1).

The auxiliary layer H is removed using, for example, $H_2SO_4+HF$. Afterward, tungsten is etched to an extent of approximately 25 nm isotropically using e.g. hot $H_2O_2$ selectively with respect to silicon nitride. The tungsten thus produces central parts M of first capacitor electrodes of capacitors, which extend from a first height H1 with respect to a y-axis y, which runs perpendicularly to the surface of the substrate 1, as far as a second height H2 with respect to the y-axis y, and contacts K. The first height H1 lies approximately 25 nm below an upper surface of the stop layer S. The second height H2 lies approximately 775 nm above the upper surface of the stop layer S. The central parts M are arranged on the contacts K which connect the central parts M to source/drain regions of the transistors T. The contacts K extend from the transistors T as far as the first height H1 and have a larger horizontal cross section than the central parts M (see FIG. 2).

Figure 2:
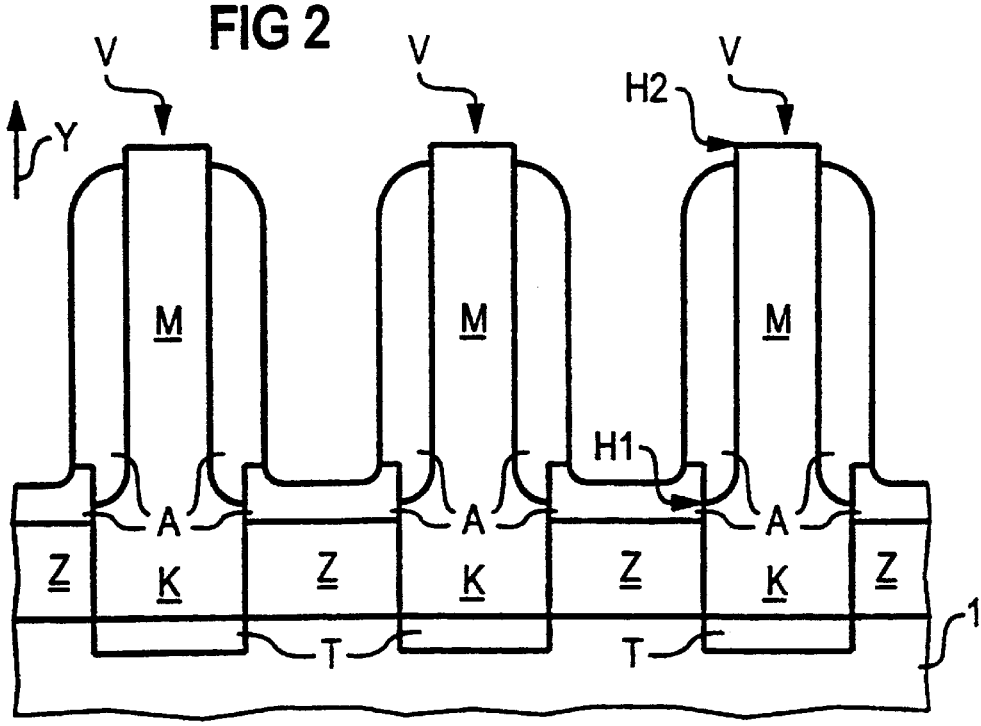
FIG. 2 is the section of FIG. 1 after the production of central parts of first capacitor electrodes of capacitors, contacts, and spacing means.

Afterward, silicon nitride is deposited to a thickness of approximately 40 nm and etched anisotropically to an extent of approximately 60 nm, so that the central parts M are partly uncovered (see FIG. 2). The silicon nitride thus produces spacers which cover lateral areas of the central parts M and form first parts of spacing means A. Second parts of the spacing means A form residual parts of the stop layer S (see FIG. 2). An upper surface of the second parts of the spacing means A lies approximately 20 nm below the upper surface of the stop layer S.

Figure 3:
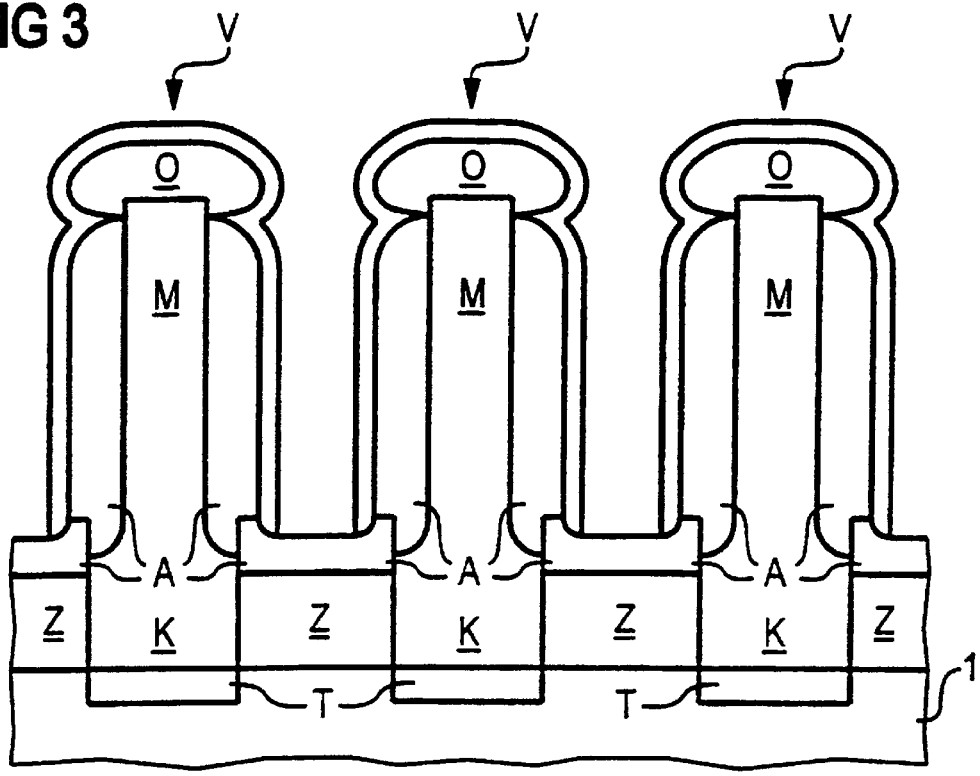
FIG. 3 is the section of FIG. 2 after upper parts of the first capacitor electrodes have been produced and tungsten has been deposited.

Upper parts O—approximately 40 nm thick—of the first capacitor electrodes are produced by selective epitaxy of tungsten, which are arranged on the central parts M and in each case project approximately 40 nm laterally from the central part M arranged underneath (see FIG. 3).

Afterward, tungsten is deposited to a thickness of approximately 15 nm (see FIG. 3).

Figure 4:
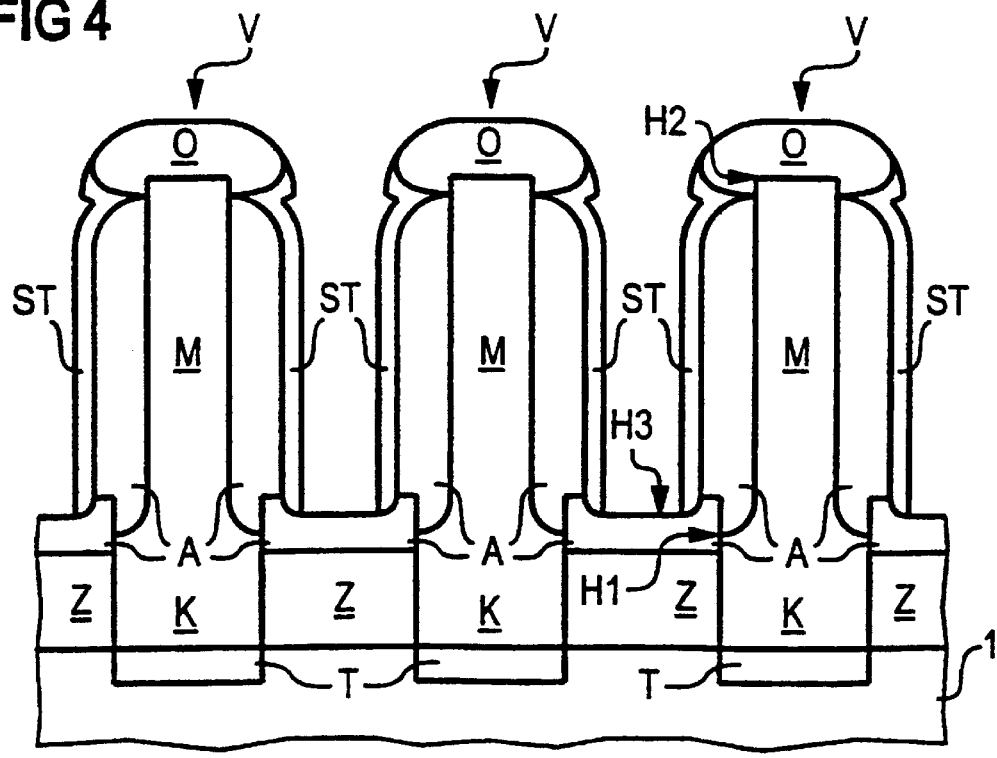
FIG. 4 is the section of FIG. 3 after side parts of the first capacitor electrodes have been produced.

In order to produce side parts ST of the first capacitor electrodes, tungsten is etched back anisotropically to a depth of 15 nm until the second parts of the spacing means A are uncovered (see FIG. 4). The side parts ST adjoin the first parts of the spacing means A and are arranged on the second parts of the spacing means A. The spacing means A are arranged below the upper parts O. The first parts of the spacing means A are arranged between the central parts M and the side parts ST. The side parts ST extend from a third height H3, at which the upper surface of the second parts of the spacing means A lies, as far as the second height H2. The side parts ST in each case laterally surround the associated central part M.

Afterward, the spacing means A are removed by etching silicon nitride selectively with respect to $SiO_2$ and tungsten isotropically using e.g. hot phosphoric acid.

Figure 5:
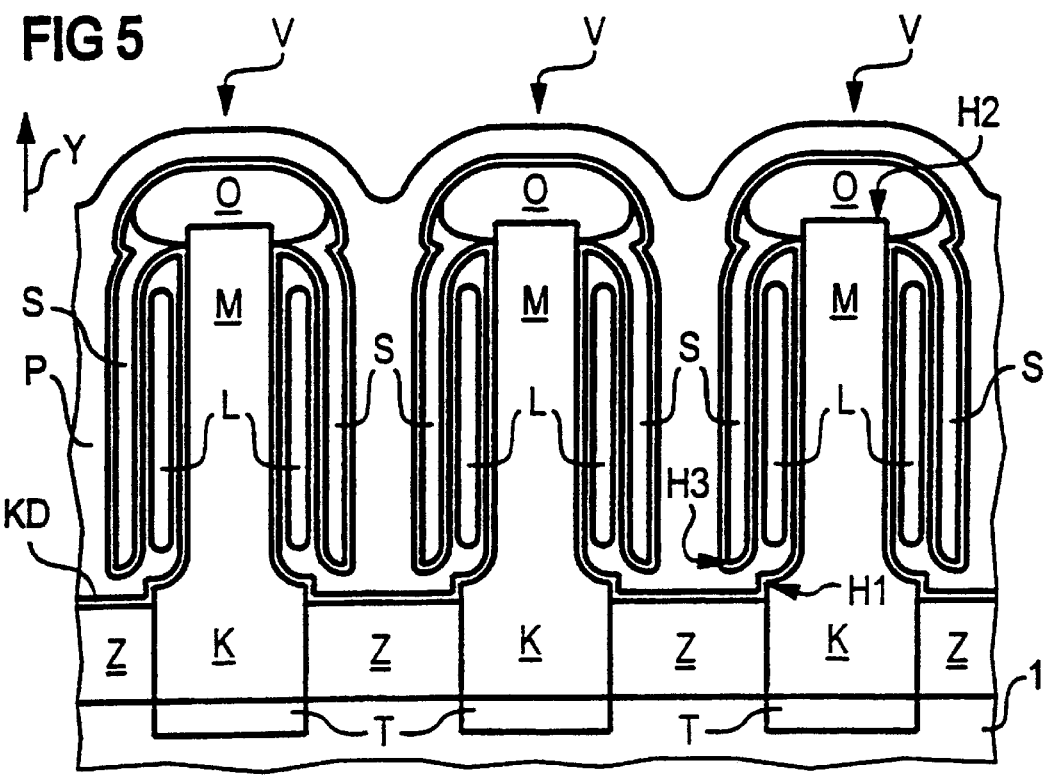
FIG. 5 is the section of FIG. 3 after the spacing means have been removed and a capacitor dielectric and a second common capacitor electrode of the capacitors have been produced.

In order to produce a capacitor dielectric KD, $Ta_2O_5$ or $Al_2O_3$ is deposited to a thickness of approximately 10 nm (see FIG. 5).

In order to produce a common second capacitor electrode P, titanium or titanium nitride is deposited to a thickness of approximately 100 nm (see FIG. 5). Voids L are produced between the central parts M and the side parts S (see FIG. 5).

The method described is used to produce a DRAM cell arrangement wherein a memory cell comprises one of the transistors T and a capacitor connected thereto, which capacitor comprises a first capacitor electrode, the capacitor dielectric KD and the second capacitor electrode P. The capacitors are arranged in rows and columns. A width of the central part M which is parallel to the direction of the rows is 50 nm. A distance between central parts M of capacitors which are adjacent to one another along the rows is 150 nm. The same values apply correspondingly to the length of the central part M which is parallel to the direction of the columns and to the distance between central parts M of capacitors which are adjacent to one another along the columns. In these methods, the minimum feature size F that can be fabricated in the technology used is 100 nm. The space requirement per memory cell is consequently $4F^2$.

Figure 6:
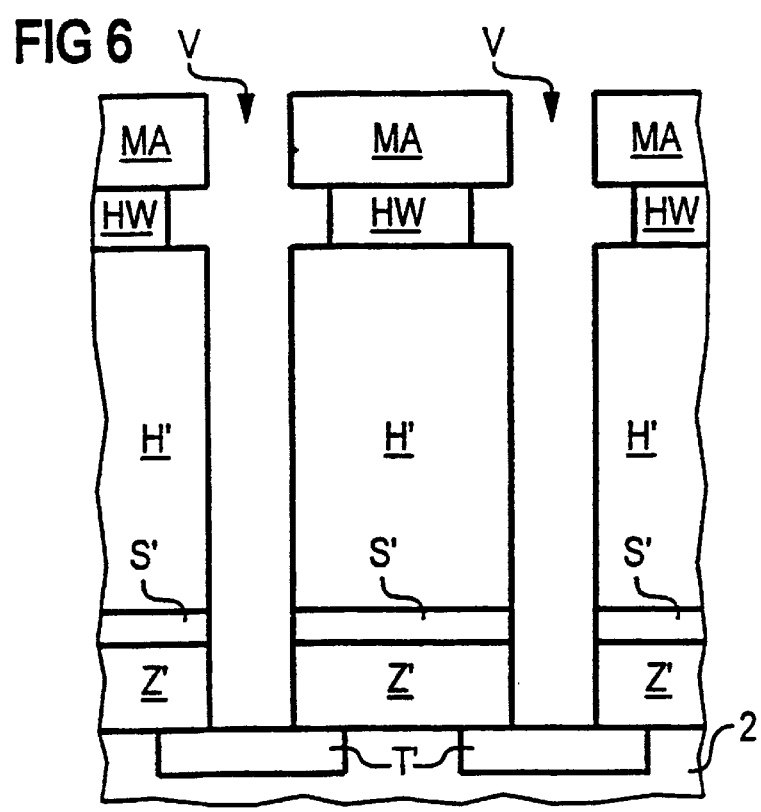
FIG. 6 is a section through a second substrate after the production of transistors, an intermediate oxide, a stop layer, an auxiliary layer, a further auxiliary layer, a mask layer, and depressions.

In a second exemplary embodiment, which is illustrated starting with FIG. 6, a second substrate 2 made of silicon is provided as the starting material. Transistors T' are produced according to the prior art in the region of a surface of the second substrate 2. An intermediate oxide Z' made of $SiO_2$ and having a thickness of approximately 200 nm is produced above that. A stop layer S' made of silicon nitride and having a thickness of approximately 30 nm is produced above that. An auxiliary layer H' made of polysilicon and having a thickness of approximately 800 nm is produced above that. A further auxiliary layer HW made of silicon nitride and having a thickness of approximately 50 nm is produced above that. A mask layer MA made of $SiO_2$ and having a thickness of approximately 100 nm is produced above that (see FIG. 6).

A non-illustrated first photoresist mask is produced and patterned with the aid of a photolithographic method in such a way that it has circular openings with a diameter of approximately 100 nm. The openings are arranged in a matrix of rows and columns. By depositing photoresist to a thickness of approximately 25 nm and etching back until the mask layer MA is uncovered, the openings in the photoresist mask are reduced in size, that is to say the photoresist mask is enlarged.

Depressions V' are produced with the aid of the enlarged photoresist mask, which depressions cut through the mask layer MA and the further auxiliary layer HW and reach as far as the auxiliary layer H'.

By isotropically etching silicon nitride selectively with respect to $SiO_2$, the depressions V' are extended in the region of the further auxiliary layer HW, so that their diameters are approximately 100 nm there.

Afterward, polysilicon is etched anisotropically using e.g. $SF_6$ and silicon nitride and $SiO_2$ are etched anisotropically using e.g. $CF_4+CHF_3$, with the result that the depressions V' are deepened and reach as far as transistors T' (see FIG. 6). The first photoresist mask is removed.

By depositing and etching back photoresist, the depressions V' are filled at least to an extent such that the intermediate oxide Z' is not uncovered. Afterward, $SiO_2$ is etched isotropically and selectively with respect to silicon nitride and polysilicon, with the result that the mask layer MA is removed. The photoresist is subsequently removed again.

Figure 7:
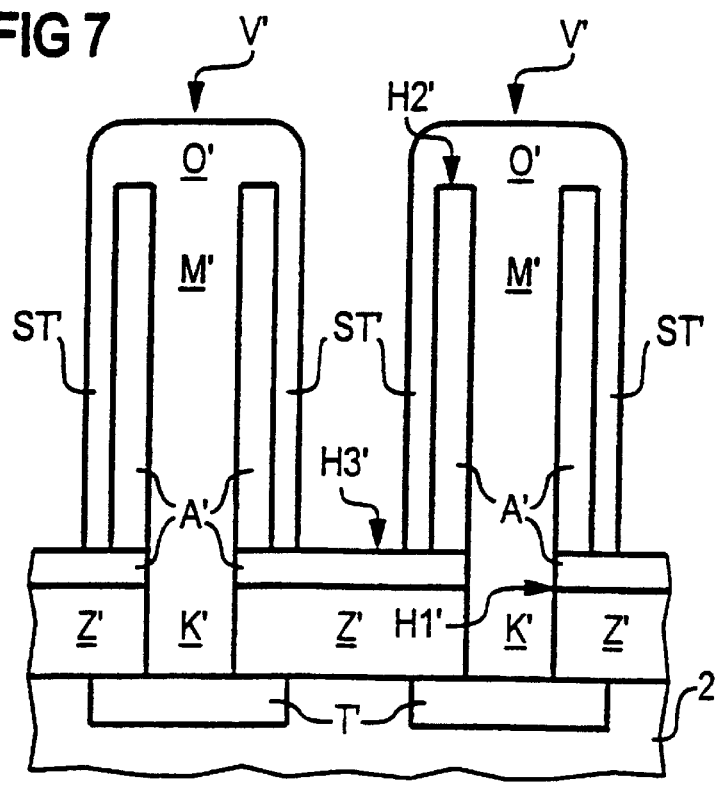
FIG. 7 is the section of FIG. 6 after the production of central parts, side parts, and upper parts of first capacitor electrodes of capacitors, contacts, and spacing means and the removal of the mask layer, the further auxiliary layer, and the auxiliary layer.

By depositing tungsten to a thickness of approximately 100 nm and chemical mechanical polishing until the further auxiliary layer HW is uncovered, in the depressions V', central parts M' of first capacitor electrodes of capacitors and underneath them contacts K' which connect the central parts M' to the transistors T' are produced in the region of the auxiliary layer H' and the stop layer S', and first parts of upper parts O' of the first capacitor electrodes are produced in the region of the further auxiliary layer HW (see FIG. 7).

Afterward, silicon nitride is etched by wet etching using e.g. hot phosphoric acid, with the result that the further auxiliary layer HW is removed. Polysilicon is etched anisotropically, the first parts of the upper parts O' acting as a mask. The stop layer S' is uncovered in the process (see FIG. 7).

Parts of the auxiliary layer H' which are arranged below the first parts of the upper parts O' form the first parts of spacing means A' which adjoin lateral areas of the central parts M'. Second parts of the spacing means A' are formed by residual parts of the stop layer S' which project laterally away from the central parts M'.

In order to produce second parts of the upper parts O' and side parts ST' of the first capacitor electrodes, tungsten is deposited to a thickness of approximately 15 nm and etched back until the second parts of the spacing means A', that is to say the stop layer S', are uncovered (see FIG. 7).

The spacing means A' are removed by wet etching of silicon nitride and polysilicon selectively with respect to tungsten and $SiO_2$.

Figure 8:
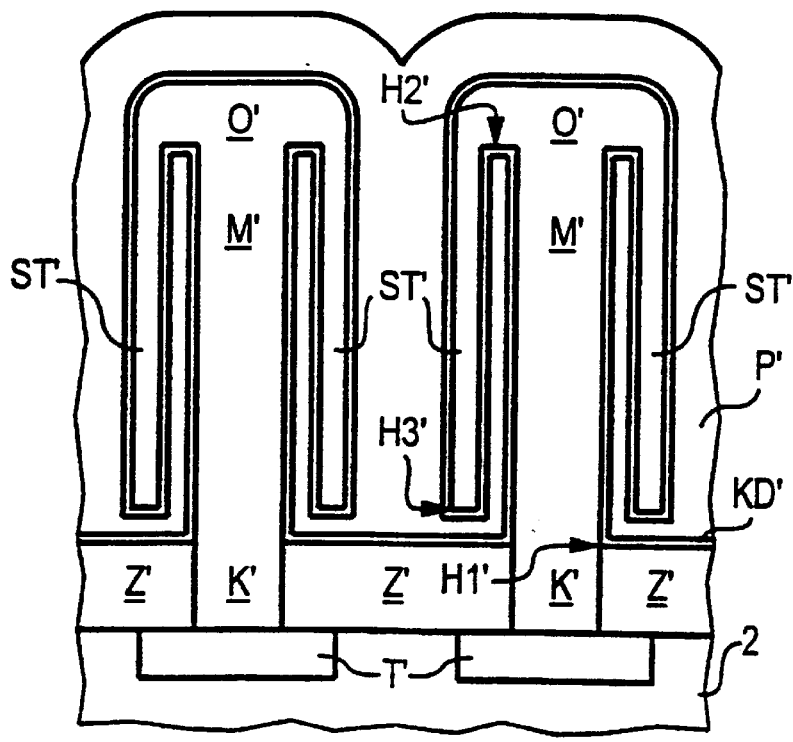
FIG. 8 is the section of FIG. 7 after the spacing means have been removed and a capacitor dielectric and a common second capacitor electrode of the capacitors have been produced.

In order to produce a capacitor dielectric KD' $Ta_2O_5$ is deposited to a thickness of approximately 10 nm. In order to produce a common second capacitor electrode P' of the capacitors, titanium is deposited to a thickness of approximately 100 nm (see FIG. 8).

The method described is used to produce a DRAM cell arrangement wherein memory cells comprise one of the transistors T' and one of the capacitors connected thereto. The central parts M' extend from a first height H1', at which a lower surface of the stop layer S' lies, as far as a second height H2', which lies approximately 830 nm above that. The side parts ST' extend from a third height H3', at which an upper surface of the stop layer S' lies, as far as the second height H2'. The upper parts O' are arranged on the side parts ST' and the central parts M'.

In a third exemplary embodiment, which will now be explained with reference to FIGS. 9 and 10, a third substrate 3 made of silicon is provided as the starting material.

Figure 9:
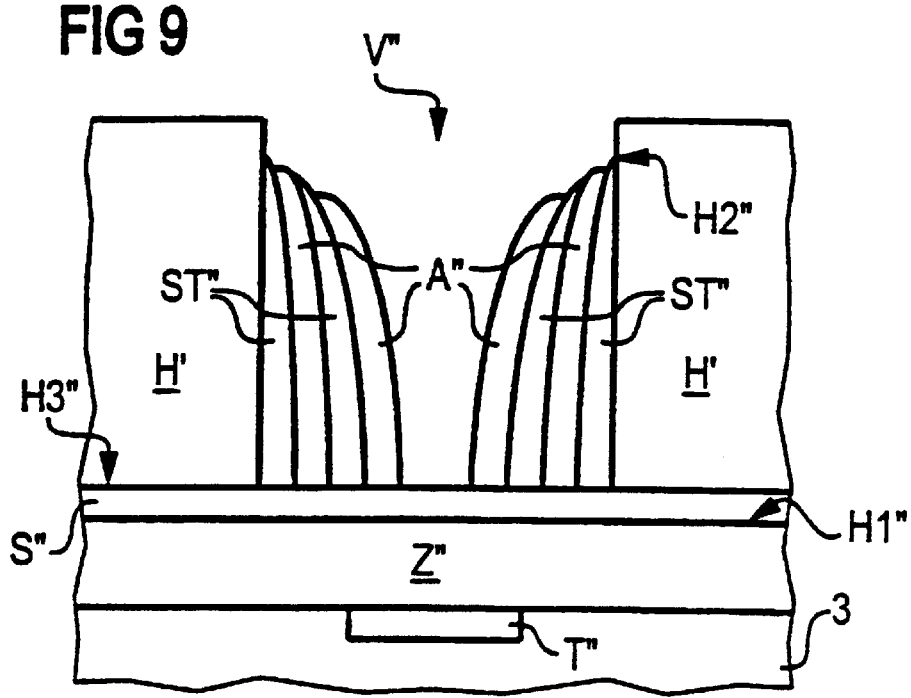
FIG. 9 is a section through a third substrate after the production of transistors, an intermediate oxide, a stop layer, an auxiliary layer, depressions, side parts of first capacitor electrodes of capacitors, and first parts of spacing means.

As in the first exemplary embodiment, transistors T", an intermediate oxide Z", a stop layer S", an auxiliary layer H" and depressions V" are produced (see FIG. 9). In contrast to the first exemplary embodiment, the depressions V" reach only as far as the stop layer S" and have a square horizontal cross section with a side length of approximately 300 nm. In contrast to the first exemplary embodiment, the auxiliary layer H" has a thickness of approximately 850 nm. An upper surface of the intermediate oxide Z" lies at a first height H1".

A first layer made of tungsten and having a thickness of approximately 30 nm is deposited and etched back to an extent of approximately 80 nm, so that a first side part S" of a first capacitor electrode of a capacitor is in each case produced in the depressions V".

A first layer made of silicon nitride and having a thickness of approximately 30 nm is deposited and etched back to an extent of approximately 110 nm, so that a first part of a spacing means A" is in each case produced in the depressions V".

A second layer made of tungsten and having a thickness of approximately 30 nm is deposited and etched back to an extent of approximately 110 nm, so that a second side part S" of the first capacitor electrode is in each case produced in the depressions VΔ.

A second layer made of silicon nitride and having a thickness of approximately 30 nm is deposited and etched back to an extent of approximately 140 nm, so that a second part of the spacing means A" is in each case produced in the depressions The first side part ST" extends from a third height H3", which lies at an upper surface of the stop layer S", as far as a second height H2", which lies approximately 800 nm above the third height and approximately 50 nm below the surface of the auxiliary layer H" (see FIG. 9).

Uncovered parts of the bottoms of the depressions V" are etched. The stop layer S" and the intermediate oxide Z" are cut through in the process, so that the transistors T" are uncovered. Residual parts of the stop layer S" form second parts of the spacing means A".

Afterward, tungsten is deposited to a thickness of approximately 140 nm and subjected to chemical mechanical polishing until parts of the tungsten which are arranged outside the depressions V" are removed. The tungsten produces in the depressions V", in the region above the intermediate oxide, central parts M" of the first capacitor electrodes, which are surrounded by the innermost first parts of the spacing means A", and upper parts O" of the first capacitor electrodes, which are arranged on the side parts ST", the first parts of the spacing means A" and the central parts M". In the region of the intermediate oxide Z", contacts K" are produced from the tungsten in the depressions V", said contacts connecting the transistors T" to the first capacitor electrodes (see FIG. 10).

The auxiliary layer H" is removed.

Figure 10:
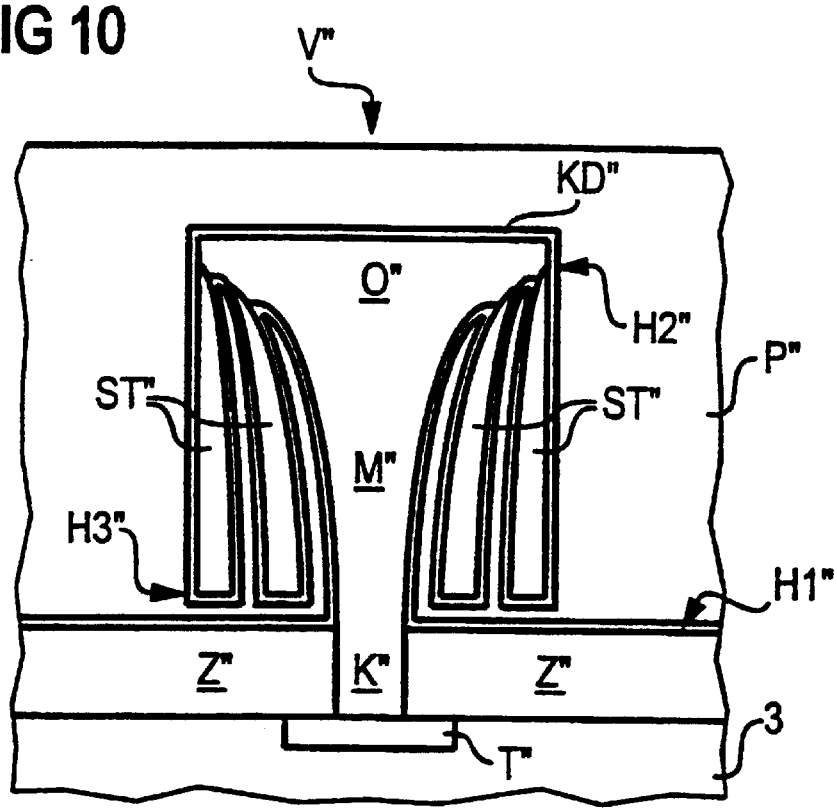
FIG. 10 is the section of FIG. 9 after the removal of the auxiliary layer and the spacing means and the production of central parts and upper parts of the first capacitor electrodes, contacts, a capacitor dielectric, and a common second capacitor electrode of the capacitors.

As in the first exemplary embodiment, the spacing means A" are removed by wet etching and a capacitor dielectric KD" and a common second capacitor electrode P" of the capacitors are produced (see FIG. 10).

The method described is used to produce a DRAM cell arrangement wherein memory cells comprise one of the transistors T" and one of the capacitors connected thereto.

There are many conceivable variations of the exemplary embodiments which likewise lie within the scope of the invention. By way of example, dimensions of the described layers, spacing means and parts can be adapted to the respective requirements. The same applies to the choice of materials.

We claim:

1. A method of producing an integrated circuit configuration with at least one capacitor, which comprises:

providing a substrate having a surface defining a y-axis extending substantially perpendicular to the surface and defining a first height, a second height above the first height, and a third height between the first height and the second height;

producing a central part of a first capacitor electrode of the capacitor to extend from the first height to the second height, by forming a depression in an auxiliary layer applied on the substrate and filling the depression at least partly with conductive material;

after producing the central part, etching the auxiliary layer no deeper than to the third height;

producing a component of the integrated circuit configuration and connecting the component to the central part produced thereabove;

producing a spacer reaching at most to the second height, by depositing and etching back material as part of a spacing means, on uncovered parts of lateral areas of the central part;

growing conductive material, by selective epitaxy, on the central part but not on the spacing means;

depositing further conductive material substantially conformally;

etching back the conductive material to thereby produce from the conductive material
at least one side part of the first capacitor electrode beside the central part and spaced apart from the central part, such that the side part extends from the third height to the second height;
an upper part of the first capacitor electrode on the side part and the central part and connecting the side part and the central part to one another; and
to partly uncover a portion of the spacing means that projects laterally below the side part;

providing the first capacitor electrode with a capacitor dielectric; and producing a second capacitor electrode adjoining the capacitor dielectric.

2. The method according to claim 1, wherein the third height is defined closer to the first height than to the second height.

3. The method according to claim 1, wherein:
the spacing means are formed to adjoin lateral areas of the central part and to project laterally away from the central part in the region of the third height;
the upper part is produced to adjoin the spacing means from above;
the side part is produced to laterally adjoin the spacing means and to be arranged on the part of the spacing means that projects laterally away from the central part in the region of the third height;
the spacing means is removed by isotropic etching; and
the capacitor dielectric and the second capacitor electrode are subsequently produced.

4. The method according to claim 1, which comprises producing the first capacitor electrode substantially from a material selected from the group consisting of tungsten and tungsten silicide.

5. The method according to claim 1, which comprises, after etching the auxiliary layer, narrowing the central part by isotropic etching.

6. The method according to claim 1, which comprises producing a further auxiliary layer on the auxiliary layer, and forming the depression to cut through the further auxiliary layer;

subsequently to producing the depression, isotropically etching the further auxiliary layer to thereby extend the depression in a region of the further auxiliary layer;

wherein, by filling the depression with the conductive material, the central part is produced in the region of the auxiliary layer and a first part of the upper part is produced in the region of the further auxiliary layer;

etching the further auxiliary layer and the auxiliary layer selectively with respect to the first part of the upper part anisotropically to the third height, so that at least one part of the spacing means is formed from the auxiliary layer below the first part of the upper part; and producing the side part and a second part of the upper part in the form of the spacer by depositing and etching back material, whereby parts of the spacer which laterally adjoin the first part of the upper part form the second part of the upper part.

7. The method according to claim 6, which comprises producing a mask layer on the further auxiliary layer, whereby the depression cuts through the mask layer; and removing the mask layer after isotropically etching the further auxiliary layer and before filling the depression.

8. The method according to claim 1, wherein the auxiliary layer is produced with a thickness such that an upper surface thereof lies higher than the second height, and further:

subsequently to producing the depression, depositing at least one conductive layer and etching back to produce the side part from the conductive layer in the depression;

subsequently to producing the side part, depositing at least one insulating layer and etched back to produce from the insulating layer in the depression a part of the spacing means that laterally adjoins the side part;

etching an uncovered part of the bottom of the depression more deeply at least as far as the first height, as yet unfilled parts of the depression are filled with conductive material, to thereby form the central part from a part of the conductive material that is surrounded by the spacing means and to form the upper part from a part of the conductive material that is arranged on the side part, on the spacing means and on the central part.

9. The method according to claim 1, which comprises:

producing a stop layer above the substrate, with an upper area of the stop layer lying at the third height, and forming the stop layer as part of the spacing means;

producing the auxiliary layer on the stop layer;

forming the depression to cut through the stop layer;

utilizing the stop layer as an etching stop during the etching of the auxiliary layer and of the conductive material of the side part to the third height.

10. The method according to claim 1, wherein the step of producing a component comprises producing a transistor, the transistor and the capacitor together forming a memory cell of a DRAM cell configuration; and the capacitors of memory cells of the DRAM cell configuration are produced in rows and columns.

11. The method according to claim 1, which comprises producing at least one further side part having a different distance from the central part than the side part.

* * * * *